(12) United States Patent
Doczy et al.

(10) Patent No.: US 7,439,571 B2
(45) Date of Patent: Oct. 21, 2008

(54) METHOD FOR FABRICATING METAL GATE STRUCTURES

(75) Inventors: Mark L. Doczy, Beaverton, OR (US); Mark Y. Liu, Portland, OR (US); Jack Kavalieros, Portland, OR (US); Justin K. Brask, Portland, OR (US); Matthew V. Metz, Hillsboro, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/120,353

(22) Filed: May 2, 2005

(65) Prior Publication Data

US 2005/0202644 A1    Sep. 15, 2005

Related U.S. Application Data

(62) Division of application No. 10/748,345, filed on Dec. 29, 2003, now abandoned.

(51) Int. Cl.
*H01L 29/788* (2006.01)
*H01L 29/76* (2006.01)

(52) U.S. Cl. ............... 257/315; 257/316; 257/382; 257/E29.3

(58) Field of Classification Search .......... 438/151, 438/199, 662; 257/315, 316, 382, E29.3
See application file for complete search history.

(56) References Cited

U.S. PATENT DOCUMENTS

| 5,627,427 | A  | * | 5/1997  | Das et al. ............... 313/308 |
| 6,040,224 | A  | * | 3/2000  | Tsukamoto ............. 438/308 |
| 6,310,367 | B1 | * | 10/2001 | Yagishita et al. ......... 257/190 |
| 6,495,437 | B1 | * | 12/2002 | Yu ........................ 438/591 |
| 6,599,819 | B1 | * | 7/2003  | Goto ...................... 438/542 |
| 6,653,698 | B2 | * | 11/2003 | Lee et al. ................ 257/407 |
| 6,783,591 | B1 | * | 8/2004  | Halliyal et al. ........... 117/89 |
| 6,794,234 | B2 | * | 9/2004  | Polishchuk et al. ...... 438/199 |
| 6,890,807 | B2 | * | 5/2005  | Chau et al. ............. 438/199 |
| 7,005,365 | B2 |   | 2/2006  | Chambers |
| 7,015,534 | B2 | * | 3/2006  | Colombo ................ 257/314 |
| 2002/0105033 | A1 | * | 8/2002 | Zhang .................... 257/353 |
| 2004/0126977 | A1 | * | 7/2004 | Bustos et al. ........... 438/305 |

OTHER PUBLICATIONS

Pending U.S. Appl. No. 10/748,345, filed Dec. 29, 2003; inventor: Doczy Office Action dated Nov. 30, 2006.

* cited by examiner

*Primary Examiner*—Luan Thai
(74) *Attorney, Agent, or Firm*—Kathy J. Ortiz

(57) ABSTRACT

Methods of forming a microelectronic structure are described. Those methods comprise providing a substrate comprising source/drain and gate regions, wherein the gate region comprises a metal layer disposed on a gate dielectric layer, and then laser annealing the substrate.

6 Claims, 4 Drawing Sheets

METHOD FOR FABRICATING METAL GATE STRUCTURES

This U.S. Patent application is a divisional of U.S. patent application Ser. No. 10/748,345 filed Dec. 29, 2003.

FIELD OF THE INVENTION

The present invention relates to the field of microelectronic devices, and more particularly to methods of fabricating metal gate transistors.

BACKGROUND OF THE INVENTION

Microelectronic devices are often manufactured in and on silicon wafers and on other types other substrates. Such integrated circuits may include millions of transistors, such as metal oxide semiconductor (MOS) field effect transistors, as are well known in the art. In the fabrication of MOS transistors, it is common to form doped junctions by ion implantation. For example, using a gate structure as a mask, an ion implantation may form implanted regions, such as source/drain regions, as are known in the art. As a result of the ion implantation of a dopant species, damage may occur to a semiconductor substrate. In addition, many of the implanted species may not find substitutional sites i.e., they may remain unactivated within the crystal lattice of the substrate.

In order to repair the damage and to activate the species into substitutional sites, it is common to use an annealing or heating step. For example, rapid thermal annealing (RTA) and diffusion furnace annealing are two conventional processes that may be utilized to anneal semiconductor devices.

While conventional annealing techniques may commonly be used when a gate structure comprises a polysilicon material, problems may occur when the gate structure comprises a metal material. For example, one problem that may occur is that a metal gate material may undergo undesired phase changes when using a conventional annealing process. Such phase changes may change the work function of a metal gate structure, which may adversely affect the performance of a transistor.

Another problem that may occur when using conventional annealing techniques with a metal gate structure is that the metal gate material may diffuse into an underlying gate dielectric layer, for example. Referring to FIG. 2a, a gate structure 202 may comprise a gate dielectric layer 204, a metal layer 206 (such as a work function metal layer, as is known in the art), a polysilicon fill layer 208, and a spacer 210.

The gate structure 202 may also comprise source/drain regions 212 that are implanted with a plurality of implanted species 216. The polysilicon fill layer 208 may also be implanted with the plurality of implanted species 216. A pre-anneal depth 220 of the metal layer 206 may be bounded by the top 205 of the underlying gate dielectric layer 204 and the bottom 207 of the polysilicon fill layer 208. The gate structure 202 may be disposed on a substrate 203, such as a silicon substrate. A conventional annealing process 218, such as an RTA or diffusion process, may be performed on the gate structure 202.

After the conventional annealing process 218 has been performed, the plurality of implanted species 216 may be activated within the crystal lattice of the gate structure 202, such as within the source/drain regions 212. Unfortunately, the conventional annealing process may be of such a time duration that the metal layer 206 may undergo a phase change, or may diffuse into the underlying gate dielectric layer 204 and/or may diffuse into the upper polysilicon fill layer 208 (see FIG. 2b). Consequently, a post-anneal depth 226 of the metal layer 206 may be larger than the pre-anneal depth 220 of the metal layer 206. This is due to the diffused polysilicon fill layer portion 222 of the metal layer 206 and the diffused gate dielectric layer portion 224 of the metal layer 206.

The phase change or the diffusion of the metal layer 206 into the gate dielectric layer 204 and/or into the upper polysilicon fill layer 208 may cause undesirable changes in the work function of the metal layer 206, as well as shorting etc. that may adversely affect the performance of the device. In addition, a source/drain junction depth 228 may be larger than is desired for a particular application, due to the amount of time required to anneal the gate structure 202 using the conventional annealing process 218.

For example, the ratio of the source/drain junction depth 228 to a source/drain junction length 230 may be greater than about 1:2, which may be undesirable for a particular application since shallower source/drain regions 212 typically result in faster device performance, as is known in the art. Thus, there is a need for better methods of annealing implanted regions in the manufacture of integrated circuits that comprise metal gates. The methods and structures of the present invention provide such methods.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE PRESENT INVENTION

Figure 1A:
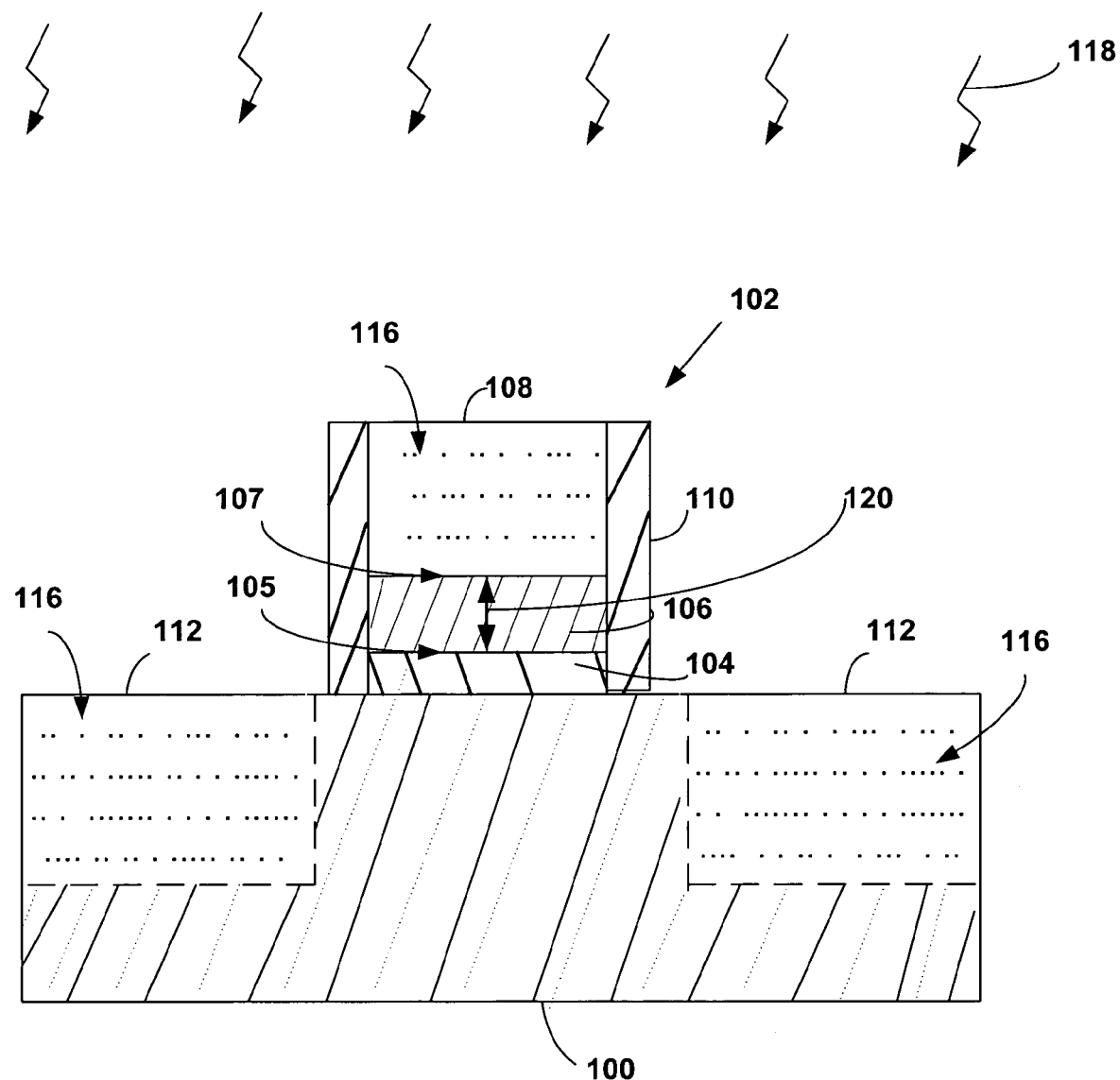
FIGS. 1a-1b represent structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming a microelectronic device are described. Those methods comprise providing a substrate comprising source/drain and gate regions, wherein the gate region comprises a metal layer disposed on a gate dielectric layer, and then laser annealing the substrate.

Laser annealing the substrate enables the fabrication of metal gate transistors that do not substantially diffuse into adjacent layers, and also enables the fabrication of transistors comprising shallow source/drain regions.

Figure 1B:
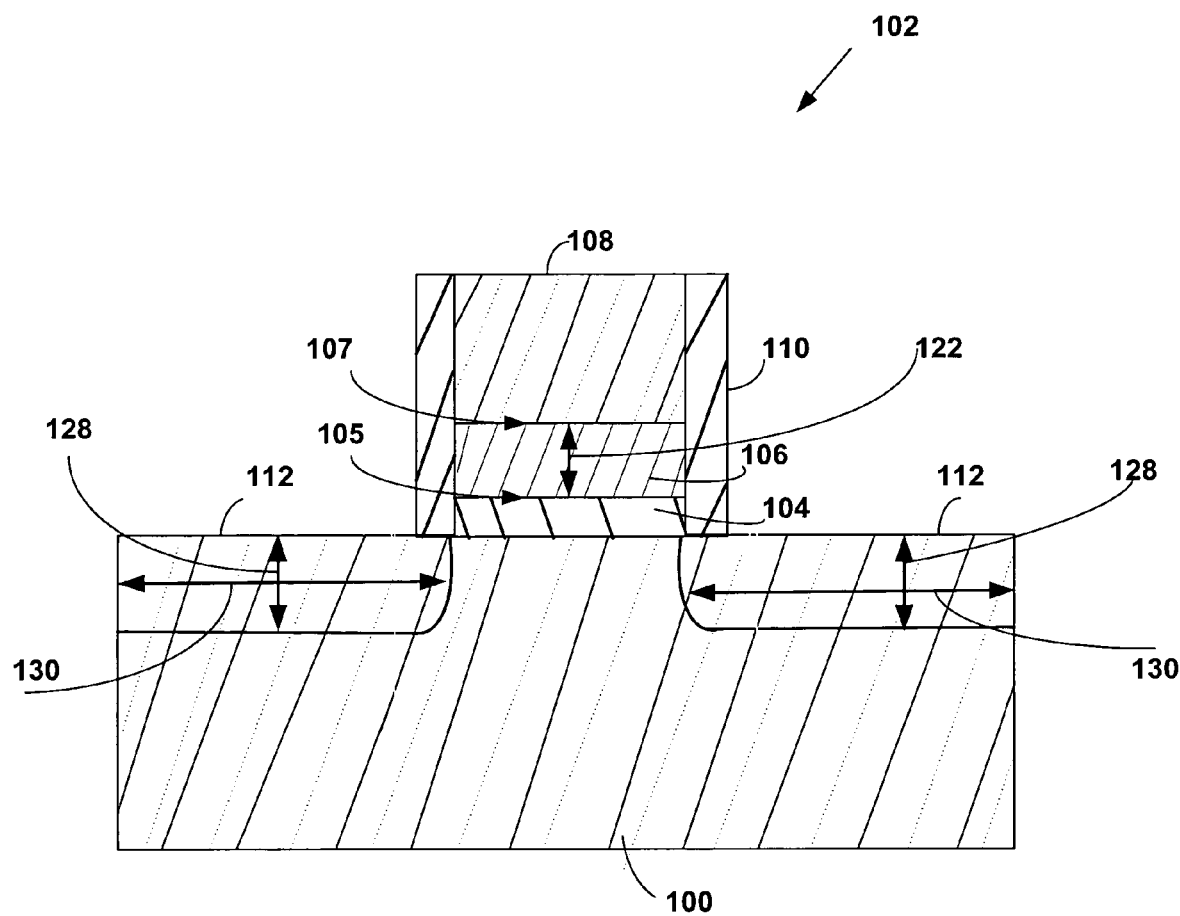

FIGS. 1a-1b illustrate an embodiment of a method and associated structures of laser annealing a substrate comprising metal gates to form shallow source/drain regions. FIG. 1a illustrates a cross-section of a portion of a substrate 100 that may preferably comprise a silicon substrate 100. The silicon substrate 100 may be comprised of materials such as, but not limited to, silicon, silicon-on-insulator, germanium, indium, antimonide, lead telluride, indium arsenide, indium phosphide, gallium arsenide, gallium antimonide, or combinations thereof.

The silicon substrate 100 may comprise a gate structure 102, that may comprise a gate dielectric layer 104. The gate dielectric layer 104 may preferably comprises a high-k gate dielectric layer 104. Some of the materials that may be used to make high-k gate dielectric layer may include: hafnium oxide, zirconium oxide, titanium oxide, and aluminum oxide. Although a few examples of materials that may be used to form the dielectric layer 104 are described here, that layer may be made from other materials that serve to reduce gate leakage.

A metal layer 106 may be disposed on the gate dielectric layer 104. The metal layer 106 may comprise any conductive material from which a metal gate electrode may be derived, such as hafnium, zirconium, titanium, tantalum, aluminum, platinum, palladium, nickel, cobalt, and ruthenium or combinations thereof, for example. The metal layer 106 may be formed using PVD ("Physical vapor deposition"), CVD ("Chemical vapor deposition"), or ALD ("Atomic Layer deposition") as are known in the art. A pre-laser anneal depth 120 of the metal layer 106 may be bounded by the top 105 of the underlying gate dielectric layer 104 and by the bottom 107 of the polysilicon fill layer 108.

The metal layer 106 may preferably comprise a work function metal layer 106, that is, the metal layer 106 may comprise a suitable work function value for operation in a microelectronic device fabricated according to the methods of the present embodiment. For example, the metal layer 106 may preferably comprise a work function value that is compatible with either a PMOS gate electrode (which typically comprises a work function value of about 5.1+/−3 electron volts) or an NMOS gate electrode (which typically comprises a work function value of about 4.1+/−3 electron volts).

The gate structure 102 may comprise a polysilicon fill layer 108, that may be disposed on the metal layer 106. The polysilicon fill layer 108 may act as a masking layer for the underlying metal layer 106 during a subsequent laser annealing process 118. The laser anneal process 118 may be performed to activate (i.e., incorporate an implanted species into the crystal lattice) a plurality of implanted species 116, that may comprise p and/or n type dopants, as are known in the art. The plurality of implanted species 116 may be located within the source/drain regions 112 and within the polysilicon fill layer 108, and may have been implanted during a subsequent process step using conventional ion implant techniques as are well known in the art. The gate structure 102 may further comprise a spacer 110, as is known in the art.

The laser annealing process 118, may be performed on the substrate 100, and consequently may be performed on the gate structure 102. The laser annealing process 118 may comprise utilizing a laser beam, such as an excimer laser beam for example, but may comprise any type of laser beam and/or process that provides sufficient energy to activate the source/drain regions 112, as well as activating the polysilicon fill layer 108 (FIG. 1b) while at the same time may preferably be of a shorter duration than more conventional annealing processes. In one embodiment, the laser annealing process 118 may comprise a pulsed laser beam that is pulsed at a time interval of about 20 nanoseconds or less. The laser annealing process 118 allows for the rapid dissipation of heat into the substrate 100, i.e., the substrate acts as a thermal sink for the laser annealing process.

Figure 2A:
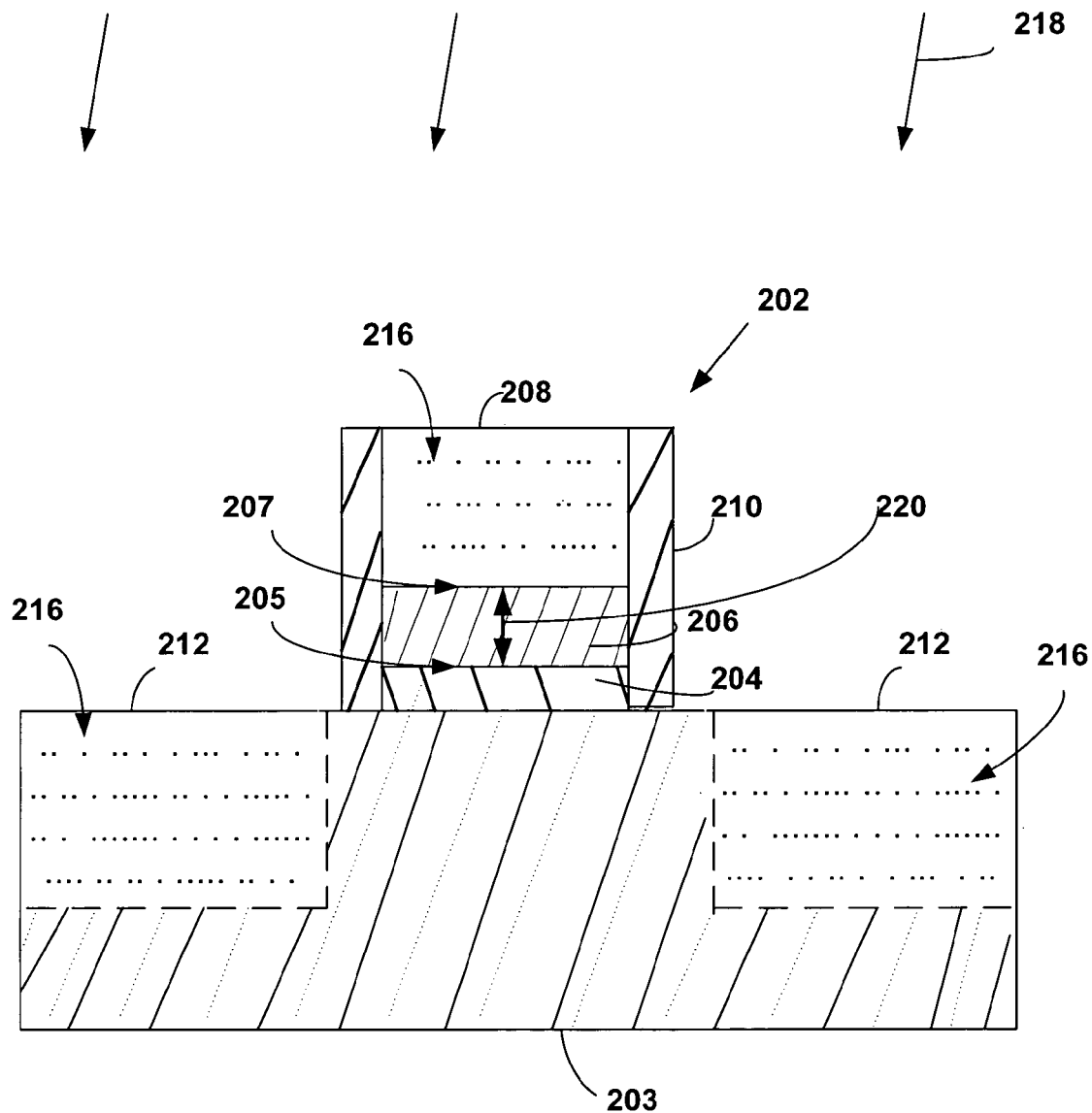
FIGS. 2a-2b represent structures from the Prior Art.
Figure 2B:
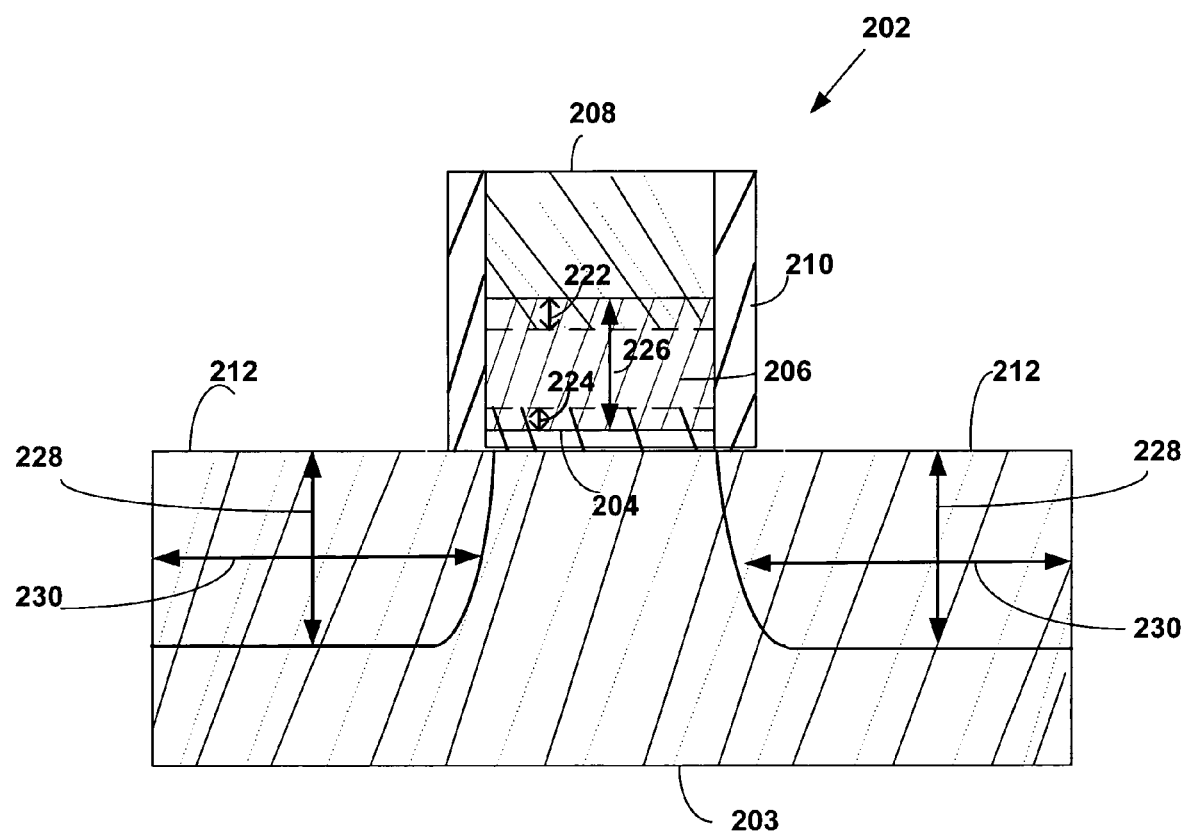

The duration and temperature of the laser annealing process 118 may vary depending upon the particular application, but will be chosen so that for a particular metal layer 106, the metal layer 106 will not substantially melt, or diffuse into either the gate dielectric layer 104 nor the polysilicon fill layer 108, as may occur in prior art annealing processes (see FIG. 2b). In other words, in the current embodiment, a post laser anneal depth 122 of the metal layer 106 may be bounded by the top 105 of the underlying gate dielectric layer 104 and by the bottom 107 of the polysilicon fill layer 108, and is substantially the same depth as the pre-laser anneal depth 120.

In addition, the laser annealing process 118 of the current embodiment does not result in deleterious phase changes and/or inter-metallic formation in the metal layer 106. This is because the laser annealing process 118 is optimized (for such parameters as time and temperature) to apply a sufficient amount of energy to the source/drain region 112 to activate the plurality of implanted species 116, but does not cause substantial diffusion, formation of inter-metallics or phase changes of the metal layer.

The laser annealing process 118 thus allows a more precise control over such anneal process parameters as time and temperature than more conventional annealing processes, such as an RTA or diffusion annealing process. Due to the greater degree of process control when using the laser annealing process 118 of the present invention, the metal layer 106 may comprise metal materials that may not otherwise be available (due to temperature and/or diffusion limitations, for example) for use in the fabrication of metal gates, such as metal carbides, for example.

Another advantage of the present invention is that after the laser annealing process 118 has been performed and the implanted species 116 of the source/drain regions 112 have been activated, a source/drain junction depth 128 may be formed that is significantly more shallow than a source/drain junction depth that may be formed when using more conventional anneal processes. For example, the ratio of the source/drain junction depth 128 to a source/drain junction length 130 may be less than about 1:2, which may be preferable for a particular application since shallower source/drain regions 112 typically result in faster device performance, as is known in the art.

Thus, the method of the present invention enables the formation of shallow source/drain regions with devices comprising metal gates, wherein the metal gates do not exhibit substantial diffusion, shorting or phase changes, for example.

As described above, the present invention describes methods of forming a microelectronic structure comprising providing a substrate comprising source/drain and gate regions, wherein the gate region comprises a metal layer disposed on a gate dielectric layer, and laser annealing the substrate.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that a microelectronic device, such as a transistor is well known in the art. Therefore, it is appreciated that the Figures provided herein illustrate only portions of an exemplary microelectronic device that pertains to the practice of the present invention. Thus the present invention is not limited to the structures described herein.

What is claimed is:

1. A structure comprising:
   a substrate comprising source/drain and gate regions, wherein a gate electrode of the gate region comprises a single layer, wherein the single layer comprises a metal layer disposed contiguously on a high k dielectric layer, and wherein the metal layer comprises a work function between about 3.9 eV and about 5.2 eV; and
   a polysilicon fill layer disposed on the single layer of the gate electrode, wherein the ratio of the depth of the source/drain regions to the length of the source/drain regions is less than about 1:2, and wherein the metal layer is not substantially diffused into the high k dielectric layer, and wherein the polysilicon fill layer and the metal layer do not comprise a nitrided sidewall.

2. The structure of claim 1 further comprising wherein the metal layer is not substantially diffused into the polysilicon layer disposed on the metal layer.

3. The structure of claim 1 wherein the high k dielectric layer is selected from the group consisting of hafnium oxide, zirconium oxide, titanium oxide, and aluminum oxide and/or combinations thereof.

4. The structure of claim 1 wherein the metal layer does not comprise an inter-metallic layer.

5. The structure of claim 1 wherein the metal layer comprises a material selected from the group consisting of tungsten, platinum, ruthenium, palladium, molybdenum and niobium, and their alloys, metal carbides, metal nitrides, and conductive metal oxides.

6. The structure of claim 1 wherein the metal layer does not comprise a phase changed metal layer.

* * * * *